United States Patent [19]

Valencia

[11] Patent Number: 4,684,820

[45] Date of Patent: Aug. 4, 1987

[54] SYMMETRICALLY CHARGED PULSE-FORMING CIRCUIT

[75] Inventor: Vance I. Valencia, San Diego, Calif.

[73] Assignee: Maxwell Laboratories, Inc., San Diego, Calif.

[21] Appl. No.: 701,127

[22] Filed: Feb. 13, 1985

[51] Int. Cl.⁴ ............................................. H03K 3/02
[52] U.S. Cl. .................................... 307/106; 307/108; 328/65; 363/24
[58] Field of Search ............... 307/106, 108, 109, 110, 307/98, 99, 100, 246; 328/60, 74, 65, 162; 250/27; 331/87; 340/174; 315/190; 363/22, 24, 26, 31, 133

[56] References Cited

U.S. PATENT DOCUMENTS

| | | | |
|---|---|---|---|
| 2,496,979 | 2/1950 | Blumlein | 171/97 |
| 2,545,018 | 3/1951 | Blumlein | 250/27 |
| 2,795,707 | 6/1957 | Sunderlin | 307/106 |
| 2,824,976 | 2/1958 | Weinberg et al. | 307/88 |
| 2,871,380 | 1/1959 | Morris et al. | 307/106 |
| 2,919,414 | 12/1959 | Neitzert | 331/87 |
| 3,051,906 | 8/1962 | Haynes | 328/65 X |
| 3,185,928 | 5/1965 | Coyle | 328/65 |
| 3,189,837 | 6/1965 | Grotz et al. | 328/162 |
| 3,211,915 | 10/1965 | Poehlman et al. | 307/106 X |
| 3,418,495 | 12/1968 | Rose | 307/246 X |
| 3,435,431 | 3/1969 | Heckler et al. | 340/174 |
| 3,578,986 | 5/1971 | McGuffin | 307/246 |
| 3,711,725 | 1/1973 | Johannessen | 307/108 |
| 3,772,601 | 11/1973 | Smith | 307/106 X |
| 3,772,613 | 11/1973 | Smith | 328/65 X |
| 3,786,334 | 1/1974 | Johannessen | 307/107 X |
| 3,798,461 | 3/1974 | Edson | 307/106 |
| 4,090,140 | 5/1978 | Carter | 328/65 |
| 4,099,128 | 7/1978 | Hooper | 328/65 |
| 4,160,214 | 7/1979 | Colin et al. | 328/65 |
| 4,274,046 | 6/1981 | Harrison | 323/355 |

Primary Examiner—William M. Shoop, Jr.
Assistant Examiner—Shik Luen Paul Ip
Attorney, Agent, or Firm—Fitch, Even, Tabin & Flannery

[57] ABSTRACT

A circuit for generating a relatively high voltage, fast rise time pulse for a load. The circuit includes first and a second pulse-forming networks with each network including shunt capacitance and series inductance, and with each network having an input end and an output end. The circuit also includes first and second charging circuits with one charging circuit connected to the input end of a respective one of the pulse-forming networks. Additionally, the circuit of the present invention includes switch means connected across the input end of the first network to short-circuit the input end of the first network when the switch is closed so that after interconnection of the network output ends with one another and with the load and after the capacities of the networks have been charged, operation of the switch results in a pulse of high voltage to be developed across the load due to superimposition of voltage waves.

8 Claims, 3 Drawing Figures

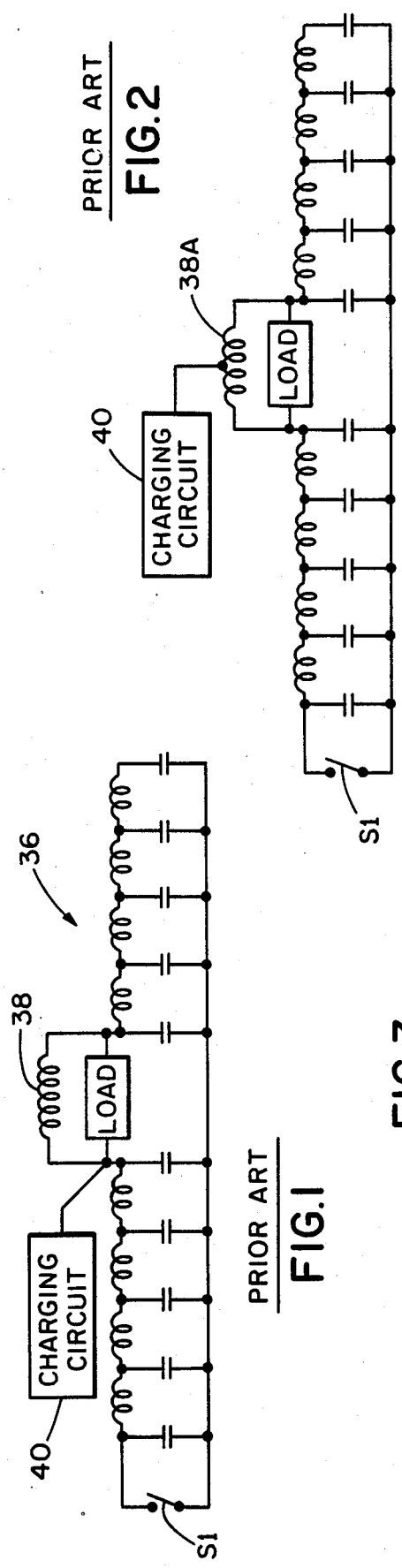

SYMMETRICALLY CHARGED PULSE-FORMING CIRCUIT

BACKGROUND OF THE INVENTION

The present invention relates to circuitry for the generation of electrical impulses and, more specifically to a symmetrically charged pulse-forming circuit.

Many circuits have been designed to generate a high voltage pulse and apply it to an electronic device. One such circuit includes two pulse-forming networks, each formed by series inductors and shunt capacitors, with the load positioned between the networks. This type of circuit has come to be known as a Blumlein pulse circuit and is of the general type shown in FIG. 3 of U.S. Pat. No. 2,496,979 to A. D. Blumlein. A charging inductor parallels the load, which is shown as a magnetron, and a charging circuit is connected to one pulse-forming network. The loads used with such circuits have characteristics of a diode in that they have a cathode and an anode. When forward biased (or in their "operating" state) they have a low impedance, and when reversed biased (or in their "non-operating state"), they exhibit a high impedance. The charging inductor has an impedance which is low compared with that of the load when in its "non-operating" state but high compared with that of the load in its "operating" state. Thus, the pulse-forming network not directly connected to the charging circuit must be energized through the charging inductor, which subjects the load to a voltage drop causing a "pre-pulse" to be applied to the load. As used herein, the term "pre-pulse" simply means that a voltage drop appears across the load during charging of one of the pulse-forming networks. After the capacitors of the pulse-forming networks making up the Blumlein pulse circuit are charged, a switch at the distal end of one of the pulse-forming networks, is closed. As will be discussed more fully hereinafter, this closing results in the energy in the one pulse-forming network being redistributed so that the polarity of the voltage across the capacitors in the first network is reversed and the reversed voltage is applied across the load in series with the voltage across the capacitors in the second network.

While some electronic devices, such as a magnetron, can tolerate the existence of a pre-pulse during charging of the networks, other electronic devices cannot. One such device is an electron beam laser. This laser has a cathode which is sensitive to the voltage applied so that voltage deviations with respect to time will prevent proper ignition and/or will disturb laser kinetics.

Another pulse-forming network arrangement of the Blumlein type is disclosed in U.S. Pat. No. 3,189,837. The circuit shown in this patent also discloses the use of a single charging circuit, but here each pulse-forming network is charged using a center-tapped charging inductor so that no pre-pulse appears across the load during charging of the capacitors in the pulse-forming networks.

SUMMARY OF THE INVENTION

Among the several aspects of the present invention may be noted the provision of an improved circuit for providing a relatively high voltage, fast rise time pulse to energize an electronic device such as an electron beam laser. The circuit provides symmetrical charging to avoid prematurely subjecting the device to a voltage drop which could prevent its proper operation. Additionally, the circuit provides isolation for the power supply and develops across the electronic load a voltage substantially equal to that to which each network has charged. The circuit of the present invention is highly efficient, reliable in use and has long service life while providing relatively low cost and ease of manufacture. Other aspects and features of the present invention will be, in part, apparent and, in part, pointed out hereinafter in the following specification and in the accompanying claims and drawings.

Briefly, the circuit of the present invention includes first and second pulse-forming networks, each having shunt capacitance and series inductance with each network having an input end and an output end. Also included is a charging circuit for each pulse-forming network, and a switch which is connected across the input end of the first pulse-forming network to short-circuit the input of that network when the switch is closed.

BRIEF DESCRIPTION OF THE DRAWINGS

FIG. 1 is a schematic circuit diagram of a prior art pulse-forming circuit;

FIG. 2 is a schematic circuit diagram of another prior art pulse-forming circuit; and FIG. 3 is a schematic circuit diagram of the pulse-forming circuit of the present invention.

DESCRIPTION OF THE PREFERRED EMBODIMENT

Referring now to the drawings, a circuit for generating a relatively high voltage, fast rise time pulse is generally indicated in FIG. 3 by reference character 20. This circuit is particularly useful for pulsed energization of a load 22 such as an electronic device having a relatively high impedance non-operating state and a relatively low impedance operating state. An example of such a device is an electron beam laser which switches from its non-operating state to its operating state upon switching of the polarity of a voltage between its anode and cathode. The circuit 20 includes first and second pulse-forming networks 24, 26, each made of a plurality of series inductors and a plurality of shunt capacitors. One end of each network is connected to a respective side of the load 22. Each pulse-forming network 24, 26 is charged by a separate starting circuit 28, 30, respectively, through a separate intermediate charging circuit 32, 34, respectively.

A circuit arrangement of this type wherein a pulse-forming network is connected to each side of the load is known as a Blumlein pulse circuit, and is shown and described in U.S. Pat. No. 2,496,979, the teachings of which are incorporated herein by reference. The original prior art Blumlein pulse circuit is shown in FIG. 1 at reference number 36. A charging inductor 38 parallels the load, and a charging circuit 40 is connected to the left pulse-forming network. A switching means, shown for purposes of explanation as simply a single-pole, single-throw switch S1, is connected to short-circuit the capacitor at the left end of the left pulse-forming network. The charging inductor 38 has an impedance large compared with that of the load when the load is in its operating state; however, the inductor impedance is relatively low compared with that of the load when in its non-operating state.

When the classic Blumlein pulse circuit is charged, current must flow through the charging inductor 38 to energize the right pulse-forming network. This results in a voltage drop across the inductor which causes the application of a premature pulse to the load. While a load such as a magnetron might be able to tolerate such a premature pulse, an electronic device such as an electron beam laser cannot. The premature pulse may prevent the laser from proper ignition or could disturb laser kinetics.

In operation of the classic Blumlein pulse circuit, after the pulse-forming network capacitors are charged, when switch S1 closes, the voltage drop which arises at the lefthand end of the network connected thereto propagates along the network towards the right. When it reaches the load, it is reflected in reversed sense and causes the load to become conducting. The cathode of the load is thus held at a negative voltage while its anode remains positive due to the voltage on the right network and this state of affairs persists until the transmitted and reflected waves are reflected at the righthand end of the right network and the left-hand of the left network respectively and return to the load whereupon the voltage across the load collapses. It will thus be seen that due to the superimposition of voltage waves reversed in sense by reflection upon voltage waves of the same polarity as that to which the left and right networks were charged, a pulse of high voltage is developed across the load. The time delays of each of the networks are preferably equal and their impedances are preferably arranged to be equal to half the operating impedance of the load so that as the load draws current, its impedance matches that of the two networks in series and a voltage is set up across the load that is one half of the open circuit voltage which would be developed in the absence of the load. Thus, with this arrangement the voltage developed across the load is substantially equal to that to which each of the networks was charged.

Another prior art Blumlein type pulse circuit is shown as prior art in FIG. 2. In this circuit the charging inductor 38A is center tapped, with the charging circuit being connected to the tap. The use of the center tapped charging inductor provides balanced charging to eliminate the premature pulse applied to the load in the circuit of FIG. 1; however, in both prior art circuits the charging inductor is connected in parallel with the load. Thus, the charging inductor stores energy during operation of the load. This, of course, increases the size of circuit components needed for operating the load as compared to the size of those required in the absence of such inductors. It is possible to place a switching device in series with the charging inductor across the load so that after charging, the charging inductor is effectively removed. However, this increases circuit cost and complexity.

Referring now to FIG. 3, each pulse-forming network 24, 26 in the pulse generating circuit 20 of the present invention includes a number of sections, each constituted by a capacitor and an inductor. Each pulse-forming network preferably includes at least 5 sections and more preferably at least 10 sections. The use of more sections yields an output pulse approaching that provided by a distributed element transmission line, the desirable square wave pulse. However, for relatively long pulses, in the microsecond regime, the use of a distributed capacitance/inductance transmission line (a coaxial cable) may not be practical.

Each starting circuit 28, 30 is connected to a standard high voltage D.C. resonant charging source and includes a capacitor C1, series connected with the primary winding of a step-up transformer T1 and with a switching device S2, such as an ignitron or a thyratron, connected across the series combination of C1 and T1. The resonant charging source includes an inductor L1, a diode D1, placed in series with the inductor, and a filter capacitor $C_{FIL}$ placed across the power supply. A controller 37 is commonly connected to the grid of each device S2 to render both devices conductive simultaneously. The step-up transformers provide isolation for the starting circuits from the high voltage circuit portions. The turns ratio of the step-up transformers is chosen to obtain the desired load voltage on the secondary windings.

Each intermediate charging circuit 32, 34 includes a capacitor C2 across the secondary of its corresponding transformer T1 with a self-switching device in the form of a saturable inductor S3 disposed in series between each capacitor C2 and its corresponding pulse-forming network. The saturable inductors present a high impedance until they saturate, and then present a relatively low impedance. More specifically, the basis of operation of the saturable inductor magnetic switches, which include magnetically permeable material, is that up to the saturation limit of that material the switching device will exhibit high inductance. However, when with time the magnetic field builds sufficiently, the permeable material will reach saturation causing the permeability to drop to that of an air core inductor. The capacitances of the capacitors C1 and C2 and the inductances of the saturable inductors S2 are chosen to provide resonant transfer of energy to the pulse-forming networks. The pulse generating circuit 20 of the present invention also includes another switching device in the form of a saturable inductor magnetic switch S4 connected across the left end of the first pulse-forming network 24. The switch S4 is designed to saturate upon the pulse-forming networks becoming charged, thereby initiating application of a voltage pulse to the load.

Operation of the pulse generating circuit 20 of the present invention, which includes, in essence, a symmetrically charged Blumlein pulse-forming network magnetic modulator, is as follows: The capacitors C1 are resonantly charged by their respective D.C. charging power supplies. Simultaneous triggering of the switching devices S2 causes the energy of the respective capacitors C1 to be resonantly transferred into the respective capacitors C2 through the respective step-up transformers T1. Generally the leakage inductance of transformers T1 is sufficient to provide the required resonant charging inductance, although additional series inductance can be added to the circuit to obtain the inductance if required. Because the circuit 20 is symmetrical, the charge polarity on the energy storage capacitors C2 of the intermediate charging circuits, is as shown. The saturable inductor switches S3 (in their high impedance state) experience a small current. The saturable inductors switches S3 are designed so that as the voltages on the capacitors C2 reach predetermined values, the integral of voltage as a function of time is such that the resulting current through the switches S3 causes them to saturate and go to their low impedance state. The energy from the capacitors C2 is thereupon resonantly transferred to the respective two pulse-forming networks 24, 26. Because these two pulse-forming networks are of substantially identical construction and are connected in series with the load in opposing polarities, the sum of the voltages across the load 22 during their charging is substantially zero. Thus, there is no substantial pre-pulse applied to the load.

It will be appreciated that as energy is transferred to the pulse-forming networks from the capacitors C2 and the capacitors C2 become discharged, the currents through the saturable inductor magnetic switches S3 are reduced. When the switches S3 are sufficiently de-energized, they revert back to their high impedance states. Meanwhile, current builds up in the saturable inductor switch S4 (in its high impedance state). The switch S4 is preferably constructed to saturate after the pulse-forming networks 24, 26 have reached a steady state condition. That is, each of the capacitors in the networks is substantially equally charged.

When the magnetic switch S4 saturates, it effectively short-circuits the left end of the pulse-forming network 24. This results in operation of the pulse-forming networks and the load substantially as described above with respect to the classic Blumlein pulse circuit arrangement, except that there is no charging inductance in parallel with the load. A zero voltage wave front moves toward the load from the short-circuited end of the network 24. Behind the wave front, energy is transferred from the capacitors to the inductors. As the wave front approaches the load 22, the load is in its high impedance state and appears, in essence, as an open circuit. When the wave reaches the load, the voltage inverts. That is, if the network was charged to $V_{01}$, the voltage would become $-V_0$. Now there is a voltage drop across the load (similar to a forward biased diode) and the load conducts (its impedance is lowered). At this time, the voltage of pulse-forming network 24 is placed in series with that of pulse-forming network 26 across the load in same polarity. As each pulse-forming network has an impedance of one half the load impedance, the voltage across the load is approximately equal to the voltage to which each pulse-forming network was charged.

The purpose of the pulse-forming circuit 20 is to provide a relatively high voltage, fast rise time, square wave pulse. Commercially available power supplies are unable to provide such pulses because of voltage limitations and due to their internal impedances. While such power supplies only can provide a relatively slow charge, they can be used, as in the present invention, to energize capacitors which can be discharged very quickly. For example, the D.C. power supplies could charge capacitors C1 in five milliseconds. The components of the circuit 20 may be designed so that, upon activation of switches S2, the capacitors C2 become suitably charged in 10 microseconds. Upon saturation of the switches S3, the capacities of the pulse-forming networks 24, 26 reach steady state in about two and one half microseconds.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A circuit for generating a relatively high voltage, fast rise time pulse for a load, said circuit comprising:
    a first pulse-forming network including shunt capacitance and series inductance, said first network including an input end and an output end;
    a second pulse-forming network including shunt capacitance and series inductance, and second network including an input end and an output end, said networks being substantially identical;
    a first charging circuit including a first charging source connected to the input end of said first network for charging the capacitance of said first network, said first charging circuit having a first switch means;
    a second charging circuit including a second charging source different than said first charging source connected to the input end of said second network for charging the capacitance of said second network, said second charging circuit having a second switch means, said charging circuits being substantially identical;
    a controller means for simultaneously triggering said first and second switch means;
    means for directly connecting the output ends of said networks in series with each other and in series with a load, said output ends being connected to provide bucking voltages upon charging by the respective charging circuits; and
    a third switch means connected across the input end of said first network to short-circuit said input end of said first network when said third switch means is closed whereby after interconnection of said network output ends with each other and with said load and after the capacitances of said networks have been charged, closing of said third switch means results in a pulse of high voltage being developed across the load due to superimposition of voltage waves.

2. A circuit as set forth in claim 1 wherein said third switch means comprises a magnetic switch formed by a saturable inductor.

3. A circuit as set forth in claim 1 wherein the impedances of said first and second pulse-forming networks are substantially equal to each other and wherein said load has a high impedance state and a low impedance state, the combined impedance of said networks in series is substantially equal to that of an impedance state of the load to be connected thereto.

4. A circuit as set forth in claim 1 wherein each of said networks comprises a plurality of sections, each section including an inductor and a capacitor and each network having at least five sections.

5. A circuit as set forth in claim 1 wherein said first charging circuit comprises a starting circuit for connection to a power supply, an intermediate charging circuit connected to said first pulse-forming network, and isolation means coupling said starting circuit to said intermediate charging circuit.

6. A circuit as set forth in claim 5 wherein said isolation means comprises a step-up transformer and said intermediate charging circuit comprises a first capacitor interconnected with the secondary winding of said transformer.

7. A circuit as set forth in claim 6 wherein said starting circuit comprises a second capacitor in series with the primary winding of said transformer, and further comprises a triggerable switching device interconnected with said first capacitor and said primary winding, triggering of said switching device resulting in transfer of energy from said second capacitor to said first capacitor.

8. A circuit as set forth in claim 7 wherein said intermediate charging circuit further comprises a magnetic switch in the form of a saturable inductor connected in series between said first capacitor and said first pulse-forming network.

* * * * *